(12) United States Patent
Boas et al.

(10) Patent No.: US 6,215,106 B1
(45) Date of Patent: Apr. 10, 2001

(54) THERMALLY PROCESSING A SUBSTRATE

(75) Inventors: Ryan C. Boas, Fremont; Ajit Balakrishna, Sunnyvale; Benjamin B. Bierman, Fremont; Brian L. Haas, San Jose; Dean Jennings, San Ramon; Wolfgang R. Aderhold, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/350,415

(22) Filed: Jul. 8, 1999

Related U.S. Application Data

(63) Continuation of application No. 08/884,192, filed on Jun. 30, 1997.

(51) Int. Cl.$^7$ .................................................. F27B 5/14
(52) U.S. Cl. ........................ 219/390; 34/58; 118/724; 392/416
(58) Field of Search .................................... 219/390, 405, 219/411; 392/416, 418; 118/724, 725, 50.1; 34/58

(56) References Cited

U.S. PATENT DOCUMENTS

| | | | |
|---|---|---|---|
| 5,238,499 | * 8/1993 | Van De Ven et al. | 118/724 |
| 5,281,552 | 1/1994 | King et al. | 437/131 |
| 5,624,499 | * 4/1997 | Mizuno et al. | 118/725 |
| 5,711,815 | * 1/1998 | Lee et al. | 118/725 |
| 5,773,337 | 6/1998 | Lee | 438/199 |
| 5,882,991 | 3/1999 | Paranjpe | 438/565 |
| 5,884,412 | 3/1999 | Tietz et al. | 34/58 |
| 5,960,555 | * 10/1999 | Deaton et al. | 34/58 |
| 6,035,100 | * 3/2000 | Bierman et al. | 392/416 |

* cited by examiner

Primary Examiner—Teresa Walberg
Assistant Examiner—Shawntina T. Fuqua
(74) Attorney, Agent, or Firm—Fish & Richardson

(57) ABSTRACT

A thermal processing method is described in which a temperature response of a substrate may be controlled during a heat-up phase or a cool-down phase, or during both phases. This reduces the thermal budget of the substrate and improves the quality and performance of devices formed on the substrate. In particular, by controlling the rate of heat transfer between the substrate and a thermal reservoir (e.g., a watercooled reflector plate assembly), the temperature response of the substrate may be controlled during the thermal process. The rate of heat transfer may changed by changing the thermal conductivity between the substrate and the thermal reservoir, by changing the emissivity of a surface of the thermal reservoir, or by changing the distance between the substrate and the thermal reservoir. The thermal conductivity may be changed by changing the characteristics of a thermal transport medium (e.g., a purge gas) located between the substrate and the thermal reservoir. For example, the thermal conductivity may be changed by changing the composition of the purge gas or the pressure of the purge gas between the substrate and the thermal reservoir. In one implementation, the substrate is heated in accordance with a heating schedule and, during the heating schedule, the rate of heat transfer between the substrate and a thermal reservoir inside the thermal processing system is changed. In another implementation, a first purge gas is supplied into the thermal processing system, the substrate is heated in accordance with a heating schedule, and a second purge gas that is different from the first purge gas is supplied into the thermal processing system.

23 Claims, 7 Drawing Sheets

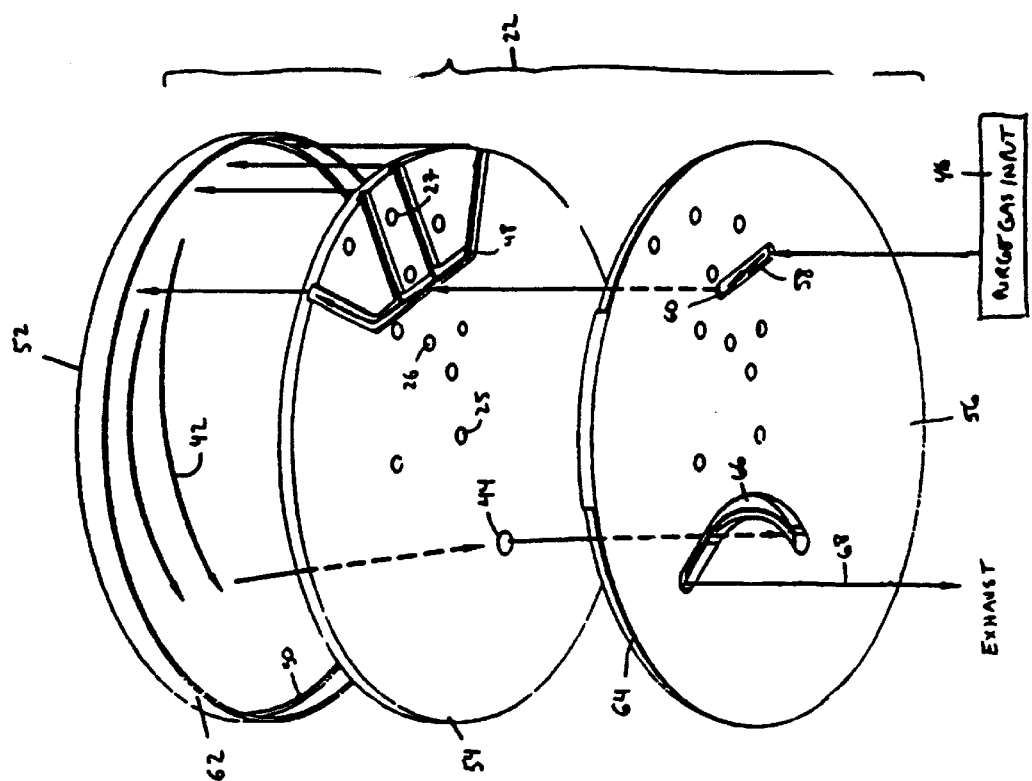
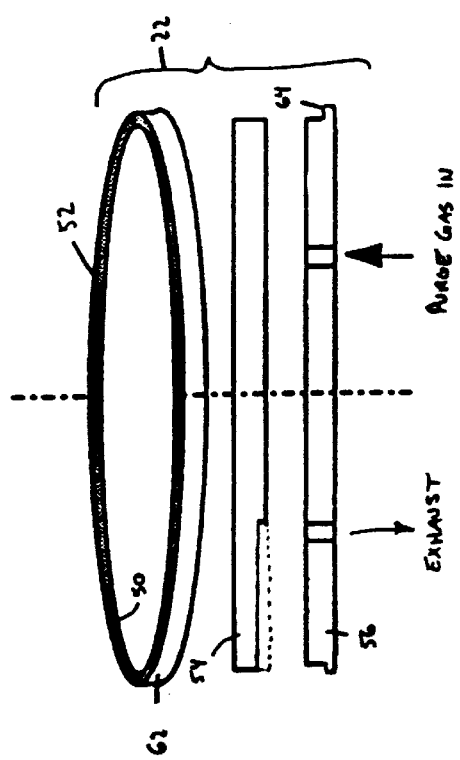

THERMALLY PROCESSING A SUBSTRATE

CROSS REFERENCE TO RELATED APPLICATIONS

This application is a continuation of U.S. application Ser. No. 08/884,192, filed Jun. 30, 1997, which is incorporated herein by reference.

BACKGROUND OF THE INVENTION

The invention relates to systems and methods of thermally processing a substrate.

Substrate processing systems are used to fabricate semiconductor logic and memory devices, flat panel displays, CD ROMs, and other devices. During processing, such substrates may be subjected to chemical vapor deposition (CVD) and rapid thermal processes (TP). RTP processes include, for example, rapid thermal annealing (RTA), rapid thermal cleaning (RTC), rapid thermal CVD (RTCVD), rapid thermal oxidation (RTO), and rapid thermal nitridation (RTN). RTP systems usually include a heating element formed from one or more lamps which radiatively heat the substrate through a light-transmissive window; RTP systems may also include one or more other optical elements, such as an optically reflective surface facing the backside of the substrate and one or more optical detectors for measuring the temperature of the substrate during processing. Many rapid thermal processes require precise control of substrate temperature over time.

SUMMARY OF THE INVENTION

The invention features a thermal processing method in which a temperature response of a substrate may be controlled during a heat-up phase or a cool-down phase, or both. This reduces the thermal budget of the substrate and improves the quality and performance of devices formed on the substrate. In particular, the inventors have realized that by controlling the rate of heat transfer between the substrate and a thermal reservoir (e.g., a water-cooled reflector plate assembly) during the thermal process, the temperature response of the substrate may be controlled.

In one aspect of the invention, the substrate is heated in accordance with a heating schedule and, during the heating schedule, the rate of heat transfer between the substrate and a thermal reservoir inside the thermal processing system is changed.

The rate of heat transfer may changed by changing the thermal conductivity between the substrate and the thermal reservoir, by changing the emissivity of a surface of the thermal reservoir, or by changing the distance between the substrate and the thermal reservoir.

The thermal conductivity may be changed by changing the characteristics of a thermal transport medium (e.g., a purge gas) located between the substrate and the thermal reservoir. For example, the thermal conductivity may be changed by changing the composition of the purge gas or the pressure of the purge gas between the substrate and the thermal reservoir. The thermal reservoir may include a relatively cool surface inside the processing chamber. The thermal conductivity between the substrate and the relatively cool surface may be increased during a cool-down phase of the heating schedule. The thermal conductivity may be increased by supplying a gas with a relatively high thermal conductivity between the substrate and the relatively cool surface. A first purge gas (e.g., nitrogen, argon and xenon) may be supplied between the substrate and the relatively cool surface during a heat-up phase of the heating schedule, and a second purge gas (e.g., helium and hydrogen) may be supplied between the substrate and the relatively cool surface during the cool-down phase of the heating schedule, the second purge gas having a thermal conductivity that is greater than the thermal conductivity of the first purge gas.

In another aspect of the invention, a first purge gas is supplied into the thermal processing system, the substrate is heated in accordance with a heating schedule, and a second purge gas that is different from the first purge gas is supplied into the thermal processing system.

The second purge gas may be supplied into the thermal processing system during a cool-down phase of the heating schedule. In one embodiment, the second purge gas is supplied into the thermal processing system at or near the time the substrate temperature has been heated to a target peak temperature. The second purge gas may be supplied into the thermal processing system while the substrate temperature is decreasing. The first purge gas may be supplied into the thermal processing system during a heat-up phase of the heating schedule.

In one embodiment, the thermal conductivity of the second purge gas is greater than the thermal conductivity of the first purge gas. In this embodiment, the second purge gas includes helium or hydrogen or both, and the first purge gas includes nitrogen and the second purge gas includes helium. The second purge gas may be supplied into the thermal processing system between the substrate surface and a thermal reservoir inside the thermal processing system. During a heat-up phase of the heating schedule, the first purge gas may be supplied into the thermal processing system between the substrate surface and the thermal reservoir. During a cool-down phase of the heating schedule, the second purge gas may be supplied into the thermal processing system between the substrate surface and the thermal reservoir.

Among the advantages of the invention are the following. The results of certain thermal processing methods (e.g., methods of forming ultra shallow junctions) are improved if the rates at which substrates are heated or cooled inside the thermal processing system are high. By changing the rate at which heat is transferred between a substrate and a thermal reservoir inside the processing chamber during the thermal process, the heat-up phase or the cool-down phase, or both phases, may be optimized to improve the quality of the devices produced.

Other features and advantages will become apparent from the following description, including the drawings and the claims.

BRIEF DESCRIPTION OF THE DRAWINGS

FIGS. 3A and 3B are exploded views of the reflector plate assembly and the fluid injector shown in FIG. 1.

DETAILED DESCRIPTION

Figure 1:
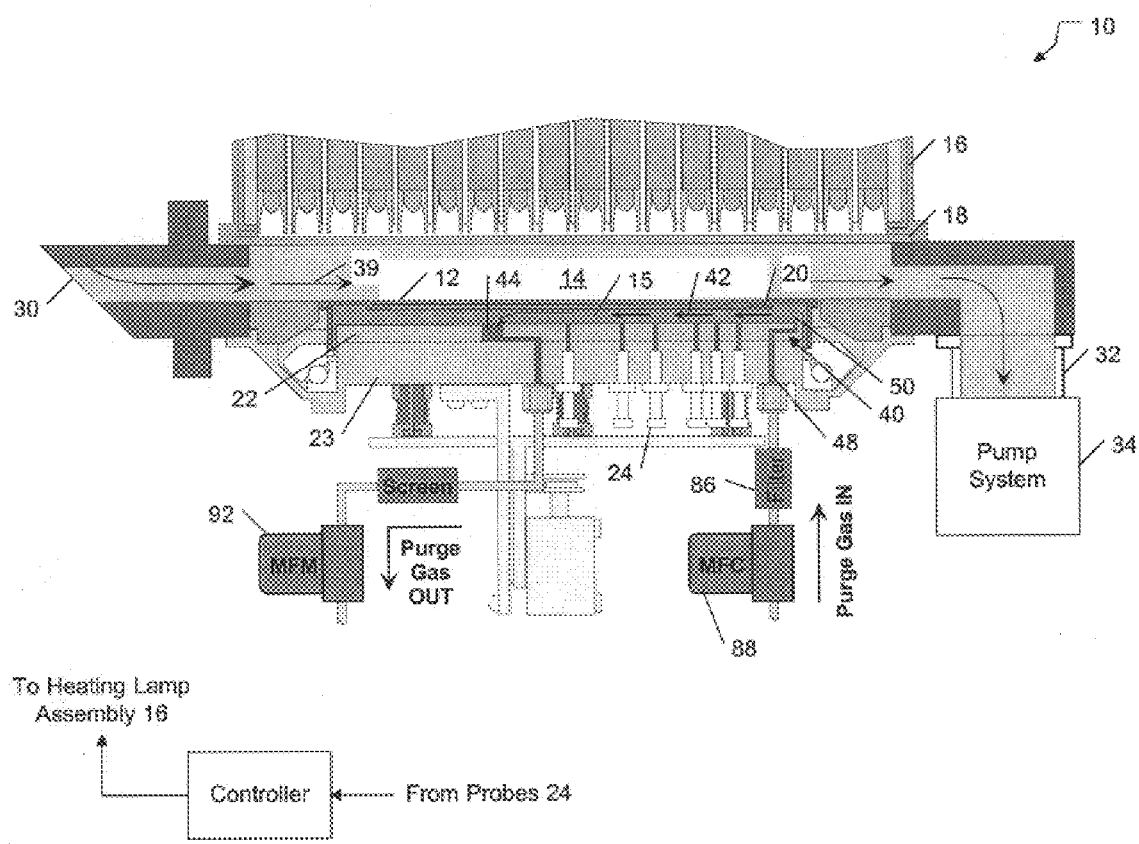
FIG. 1 is a diagrammatic side view of a portion of a thermal processing system, including a reflector plate assembly and a fluid injector.

Referring to FIG. 1, a system 10 for processing a substrate 12 includes a processing chamber 14 that is radiatively heated by a water-cooled heating lamp assembly 16 through a quartz window 18. The peripheral edge of substrate 12 is supported by a rotatable support structure 20, which can rotate at a rate of up to about 300 rpm (revolutions per minute). Beneath substrate 12 is a reflector plate assembly 22 that acts as a thermal reservoir and has an optically reflective surface facing the backside of substrate 12 to enhance the effective emissivity of substrate 12. A reflective cavity 15 is formed between substrate 12 and the top surface of reflector plate assembly 22. In a system designed for processing eight-inch (200 mm (millimeters)) silicon wafers, reflector plate assembly has a diameter of about 8.9 inches, the separation between substrate 12 and the top surface of reflector plate assembly 22 is about 5–10 mm, and the separation between substrate 12 and quartz window 18 is about 25 mm. Reflector plate assembly 22 is mounted on a water-cooled base 23, which is typically maintained at a temperature of about 23° C.

The temperatures at localized regions of substrate 12 are measured by a plurality of temperature probes 24 which are positioned to measure substrate temperature at different radial locations across the substrate. Temperature probes 24 receive light from inside the processing chamber through optical ports 25, 26, and 27, which extend through the top surface of reflector plate assembly 22 (processing system 10 may have a total often temperature probes, only three probes are shown in FIG. 1). At the reflector plate surface, each optical port may have a diameter of about 0.08 inch. Sapphire light pipes deliver the light received by the optical ports to respective optical detectors (for example, pyrometers), which are used to determine the temperature at the localized regions of substrate 12. Temperature measurements from the optical detectors are received by a controller 28 that controls the radiative output of heating lamp assembly 16; the resulting feedback loop improves the ability of the processing system to uniformly heat substrate 12.

As shown in FIG. 1, in some thermal processes, a process gas 39 may be supplied into processing chamber 14 through a gas input 30. The process gas flows across the top surface of substrate 12 and reacts with a heated substrate to form, for example, an oxide layer or a nitride layer. Excess process gas, as well as any volatile reaction by-products (such as oxides given off by the substrate), are withdrawn from processing chamber 14 though a gas output 32 by a pump system 34. In other thermal processes, a purge gas (e.g., nitrogen) may be supplied into thermal processing chamber 14 through gas input 30. The purge gas flows across the top surface of substrate 12 to entrain volatile contaminants inside processing chamber 14.

In reflective cavity 15, a purge fluid injector 40 produces a substantially laminar flow of a purge gas 42 across the top surface of reflector plate assembly 22. Purge gas 42 is removed from reflective cavity 15 though an exhaust port 44, which may have a diameter of about 0.375 inch and may be located about 2 inches from the central axis of reflector plate assembly 22. In operation, purge gas is injected into a purge gas input 46 and is distributed through a plurality of channels 48 in reflector plate assembly 22. The purge gas is then directed against a deflector 50, which is spaced above the top surface of reflector assembly 22 by a distance, for example, of about 0.01 inch (0.25 mm), to produce the substantially laminar flow of purge gas 42.

Figure 2A:
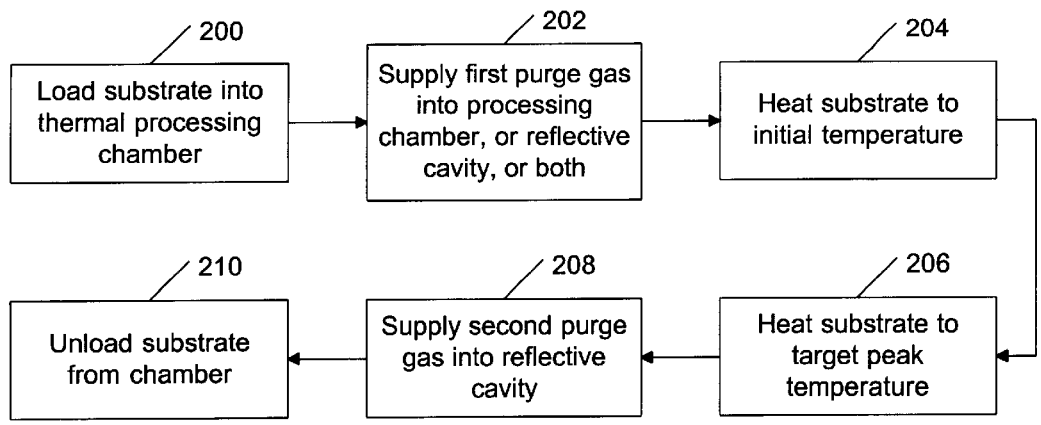
FIG. 2A is a flow diagram of a method of processing a substrate.
Figure 2B:
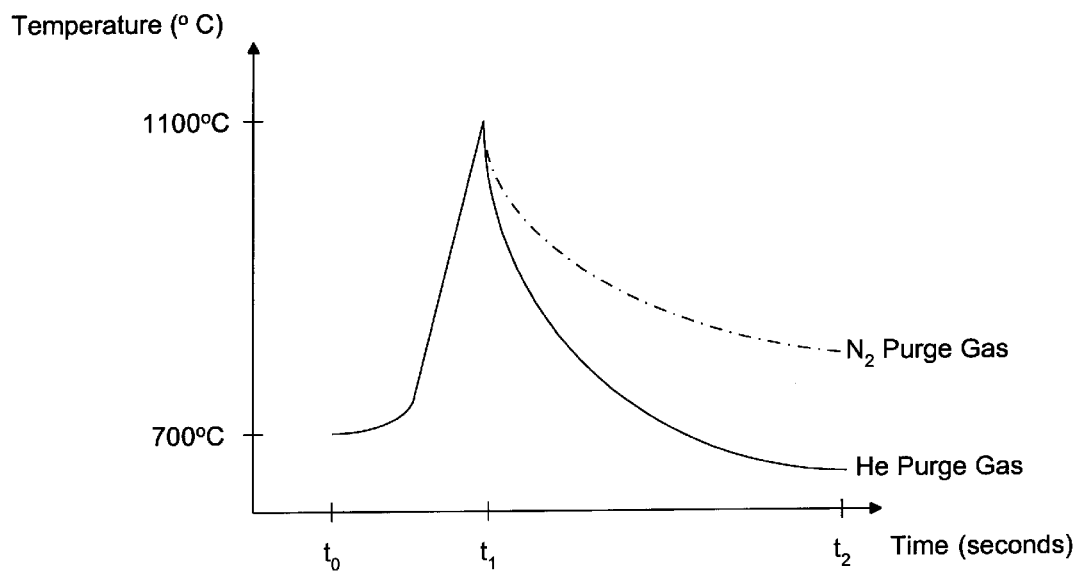
FIG. 2B contains plots of substrate temperature over time during a spike anneal thermal process using a helium purge gas and during a spike anneal thermal process using a nitrogen purge gas.

Referring to FIGS. 2A and 2B, in one embodiment, an ultra shallow junction may be formed in an impurity-doped semiconductor substrate as follows. The substrate is loaded into thermal processing chamber 14 (step 200). A first purge gas (e.g., nitrogen) is supplied into thermal processing chamber 14 through gas input 30, or into reflective cavity 15 through the output of purge fluid injector 40, or both (step 202). The substrate is heated to an initial temperature of about 700° C. by heating lamp assembly 16 (step 204). At time $t_0$, heating lamp assembly 16 begins to heat the substrate to a target peak temperature of about 1100° C. (step 206). After the substrate has been heated to a temperature that substantially corresponds to the target peak temperature (at time $t_1$), the radiant energy supplied by heating lamp assembly 16 is reduced and a second purge gas (e.g., helium) is supplied into reflective cavity 15 by purge fluid injector 40 (step 208). In practice, the helium purge gas may be initiated just before the target temperature is reached so that reflective cavity 15, defined between the substrate and reflector assembly 22, is filled with the second purge gas by the time the substrate has been heated to the target temperature. If the first purge gas is being supplied by purge fluid injector 40 during the heat-up phase, the purge gas supply is switched from the first purge gas to the second purge gas at or near time $t_1$. After the substrate has cooled below a threshold temperature (e.g., below 800° C.), the substrate is removed from thermal processing chamber 14 (step 210).

The second purge gas may be introduced into reflective cavity 15 during any cool-down phase of a thermal process. For example, in another embodiment, the second purge gas may be supplied into reflective cavity 15 during the cool-down phase following a thermal soak period of a thermal process.

The inventors have realized that by changing the rate at which heat is transferred between a substrate and a thermal reservoir inside the processing chamber during the thermal process, the heat-up phase or the cool-down phase, or both phases, may be optimized to improve the quality of the devices produced.

For example, the rate at which the substrate is cooled may be substantially increased by proper selection of the purge gas supplied between substrate 12 and a thermal reservoir (e.g., water-cooled reflector plate assembly 22) inside processing system 10. In one aspect, the inventors have realized that a purge gas with a relatively high thermal conductivity (e.g., helium, hydrogen, or a combination of these gases) may increase the cool-down rate of the substrate and, thereby, improve the operating characteristics or processing yield of certain devices (e.g., ultra shallow junction transistors). For example, the rate at which the substrate cools is substantially greater when a helium purge gas is supplied into reflective cavity 15 than when a purge gas (e.g., nitrogen) with a lower thermal conductivity is used. As shown in FIG. 2B, between times $t_1$ and $t_2$ (which may be on the order of about 6 seconds) the substrate temperature has cooled down from about 1100° C. to about 650° C. with a helium purge gas, whereas the substrate temperature has cooled down to only about 800° C. in the same amount of time with a nitrogen purge gas. In another aspect, the inventors have realized that a purge gas with a relatively low thermal conductivity (e.g., nitrogen, argon, xenon or a combination of two or more of these gases) may be supplied into reflective cavity 15 to increase the rate at which the substrate temperature increases during the heat-up phase of the thermal process (e.g., between times $t_0$ and $t_1$; FIG. 2B) by reducing the thermally coupling between substrate 12 and reflector plate assembly 22. Thus, by proper selection of the purge gases supplied between the substrate and a thermal reservoir during the heat-up and cool-down phases of the thermal process, the overall thermal budget— i.e., the integral of substrate temperature T(t) over a fixed period of time: ∫T(t)·dt—may be reduced. This improves the quality of certain devices produced by such a thermal process.

Referring to FIGS. 3A and 3B, in one embodiment of a purge reflector 40, reflector plate assembly 22 includes a deflector ring 52, a top reflector plate 54, and a bottom reflector plate 56. Bottom reflector plate 56 has a horizontal channel 58 for receiving purge gas from input 46 and for delivering the purge gas to a vertical channel 60, which communicates with a plurality of horizontal channels 48 in top reflector plate 54. Horizontal channels 48 distribute the purge gas to different locations at the periphery of top reflector plate 54. Deflector ring 52 includes a peripheral wall 62 which rests on a lower peripheral edge 64 of bottom reflector plate 56 and, together with the peripheral wall of top reflector plate 54, defines a 0.0275 inch wide vertical channel which directs the purge gas flow against deflector 50 to produce the substantially laminar flow of purge gas across the top surface of reflector plate 54. The purge gas and any entrained volatile contaminants are removed from the processing chamber through exhaust port 44. A horizontal channel 66 in bottom reflector plate 56 receives the exhausted gas from exhaust port 44 and directs the exhausted gas to a line 68 that is connected to a pump system. Each of the channels 48, 58, and 60 may have a cross-sectional flow area of about 0.25 inch by about 0.1 inch.

Figure 3C:
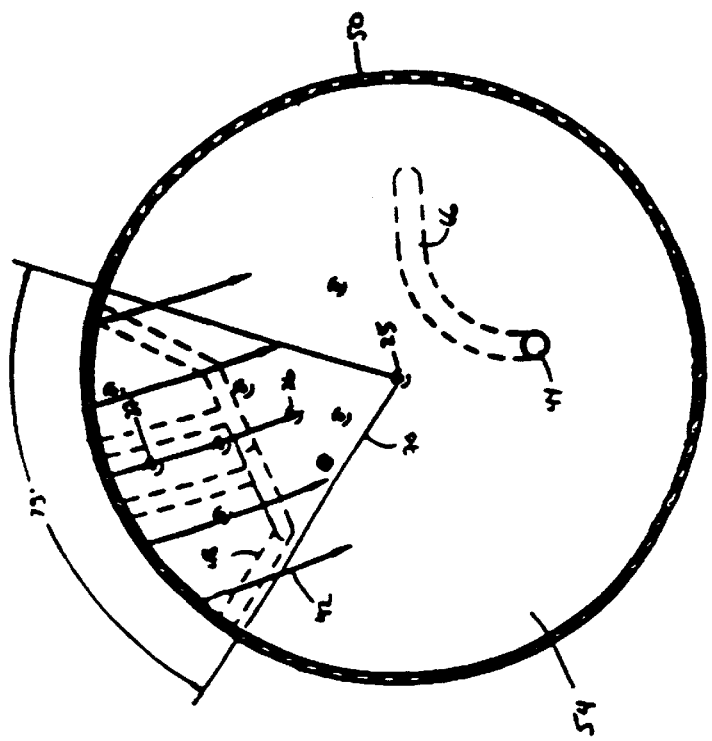
FIG. 3C is a diagrammatic top view of the reflector plate assembly and the fluid injector of FIG. 1; features of the bottom reflector plate are shown using dashed lines.

Referring to FIG. 3C, a purge gas may be introduced into reflective cavity 15 at the top surface of top reflector plate 54 along a peripheral arc of about 75°. The resulting substantially laminar flow of purge gas 42 extends over a region of the top surface of top reflector plate 54 corresponding to the 75° sector 70, which includes nine of the ten optical ports in top reflector plate 54 (including optical ports 25, 26, and 27). In the embodiment described above, a high thermal conductivity purge gas 42 (e.g., helium or hydrogen) increases the thermal conductivity between substrate 12 and reflector assembly 22 during the cool-down phase of a rapid thermal process (e.g., between times $t_1$ and $t_2$; FIG. 2B).

Figure 4:
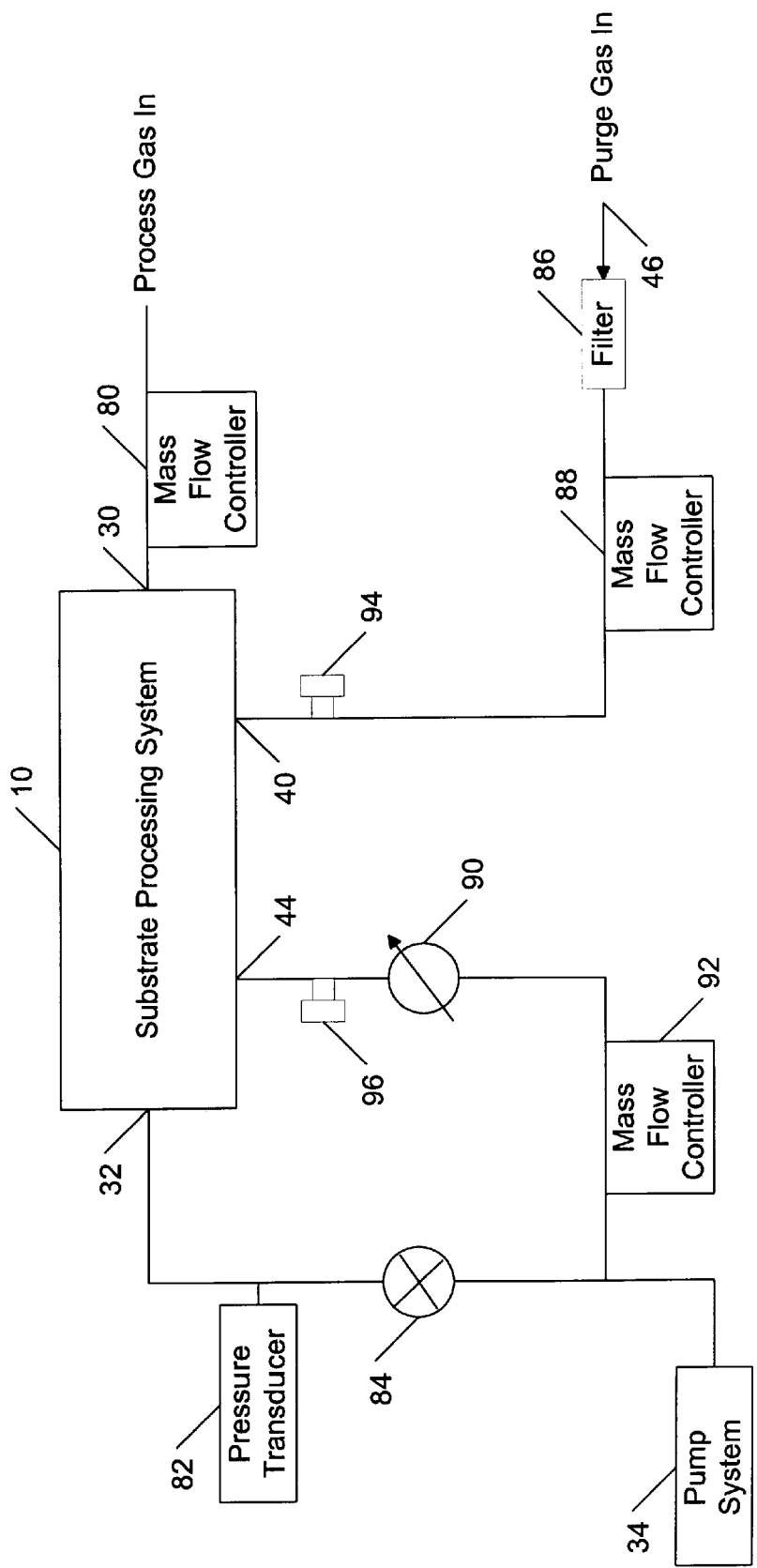
FIG. 4 is a diagrammatic view of a purge gas control system of the substrate processing system of FIG. 1.

The flow rates of purge gas and process gas are controlled by the fluid control system shown in FIG. 4. A mass flow controller 80 is used to regulate the flow of gas into processing chamber 14 through gas input 30, and a pressure transducer 82 and a pressure control valve 84 are used to regulate the rate at which gas is removed from processing chamber 14 through gas output 32. Purge gas is introduced into reflective cavity 15 through input 46 which is connected to a filter 86. A mass flow controller 88 is used to regulate the flow of purge gas into reflective cavity 15 through purge gas injector 40. An adjustable flow restrictor 90 and a mass flow meter 92 are used to regulate the rate at which purge gas is removed from reflective cavity 15. To reduce the migration of purge gas into the processing region of reflective cavity 15, above substrate 12, flow restrictor 90 is adjusted until the rate at which purge gas is introduced into reflective cavity 15 is substantially the same as the rate at which purge gas is removed from reflective cavity 15. Solenoid shut-off valves 94 and 96 provide additional control over the flow of purge gas through reflective cavity 15. In a system designed for processing eight-inch (200 mm) silicon wafers, purge gas may be flowed through reflective cavity 15 at a rate of about 9–20 slm (standard liters per minute), although the purge gas flow rate may vary depending upon the pressure inside reflective cavity 15 and the pumping capacity of pump system 34. The pressure inside reflective cavity 15 and processing chamber 14 is typically about 850 torr.

Purge gas may be supplied into reflective cavity 15 in a variety of different ways.

Figure 5:
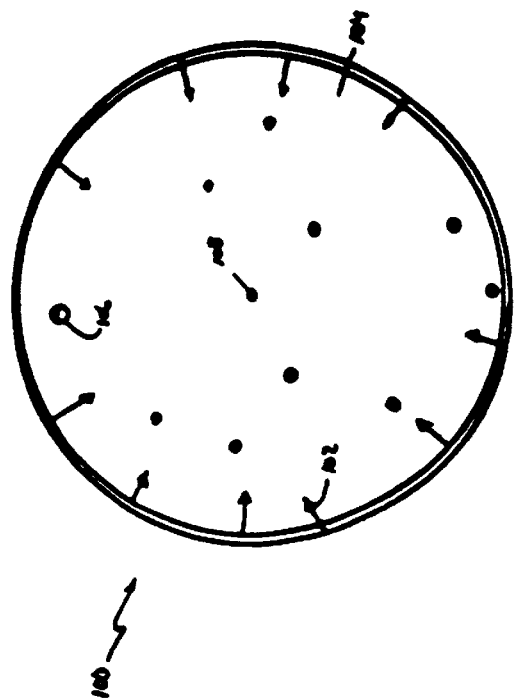
FIG. 5 is a diagrammatic top view of an alternative fluid injector.

Referring to FIG. 5, in one embodiment, a reflector plate assembly 100 is similar in construction to reflector plate assembly 22, except reflector plate assembly 100 is designed to introduce a purge gas 102 from different locations around the entire periphery of a top reflector plate 104. Purge gas 102 is removed through an exhaust port 106 that extends through top reflector plate 104. Purge gas 102 may be introduced at locations about 4.33 inches from the center of reflector plate 102, and exhaust port 106 may be located about 2 inches from the center of reflector plate 102. This embodiment may be used when optical ports 108 are distributed over the entire surface of reflector plate 102.

Figure 6A:
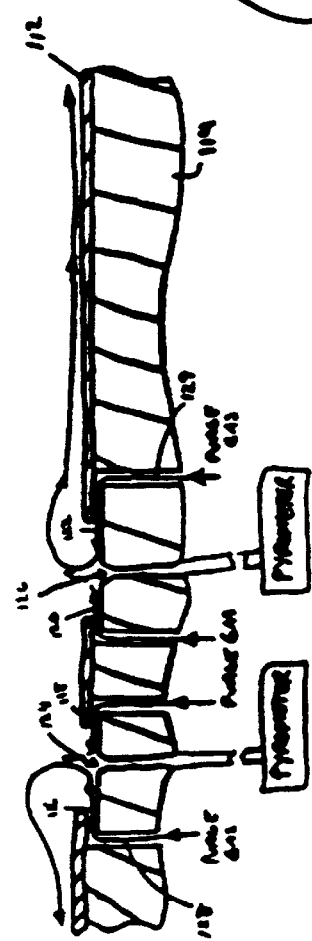
FIGS. 6A and 6B are diagrammatic side and top views of a portion of an alternative fluid injector, respectively.
Figure 6B:
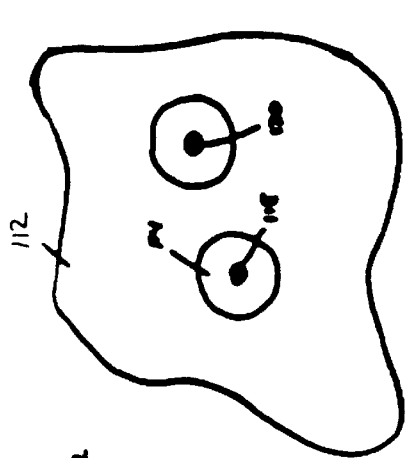

Referring to FIGS. 6A and 6B, in another embodiment, a reflector plate assembly 110 is also similar in construction to reflector plate assembly 22, except reflector plate assembly 110 includes a deflector plate 112 and a top reflector plate 114 that together define flow channels for producing a substantially laminar flow of purge gas in circumferential regions 116–122 surrounding optical ports 124 and 126. The purge gas flows through vertical annular channels 128, 129 in top reflector plate 114. The purge gas may be exhausted through an exhaust port (not shown) that extends through top reflector plate 114; the purge gas may alternatively be exhausted over the circumferential edge of reflector plate assembly 110. In this embodiment, the top surface of deflector plate 112 acts as the primary optically reflective surface that faces the backside of the substrate. Deflector plate 112 may be spaced above top reflector plate 114 by a distance of 0.01 inch (0.25 mm).

Figure 7A:
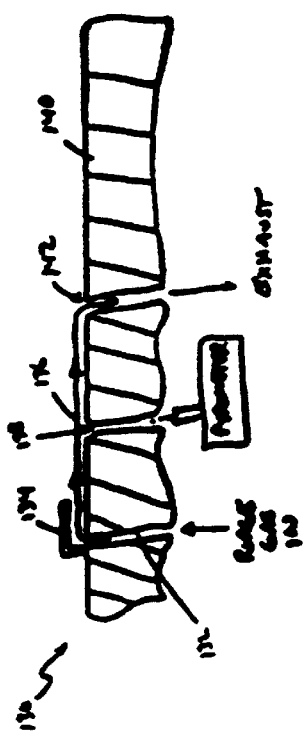
FIGS. 7A and 7B are diagrammatic side and top views of a portion of an alternative fluid injector, respectively.
Figure 7B:
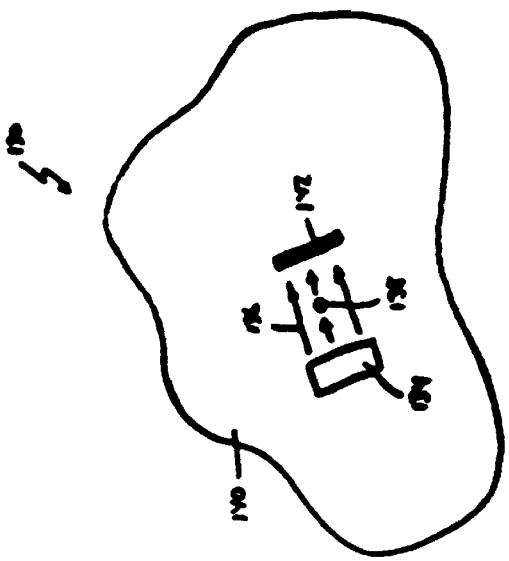

Referring to FIGS. 7A and 7B, in another embodiment, a reflector plate assembly 130 includes a vertical channel 132 for receiving a flow of a purge gas, and a slot-shaped deflector 134 for deflecting the flow of purge gas 136 as a rectangular curtain across an optical port 138 that extends through a reflector plate 140. A slot-shaped exhaust port 142 is used to remove purge gas 136. Deflector 134 may be spaced above the top surface of reflector plate 140 by a distance of about 0.01 inch (0.25 mm).

Figure 8A:
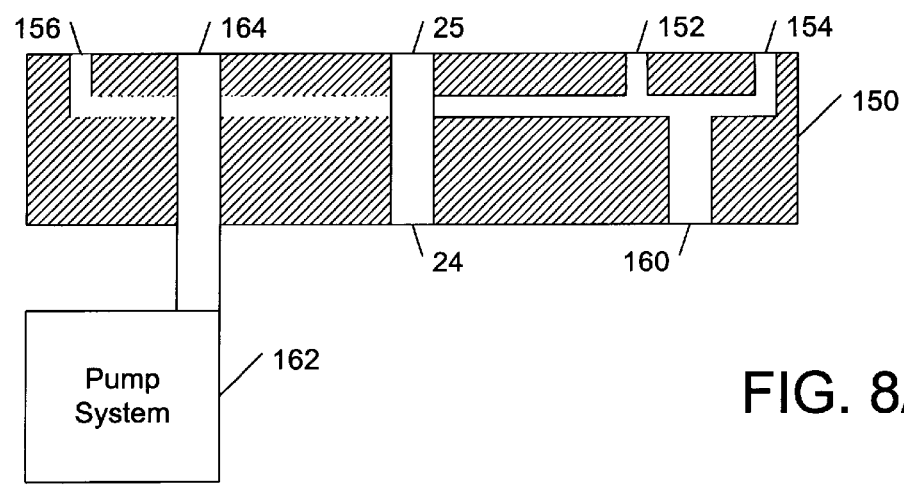
FIG. 8A and 8B are diagrammatic side and top views of another fluid injector, respectively.
Figure 8B:
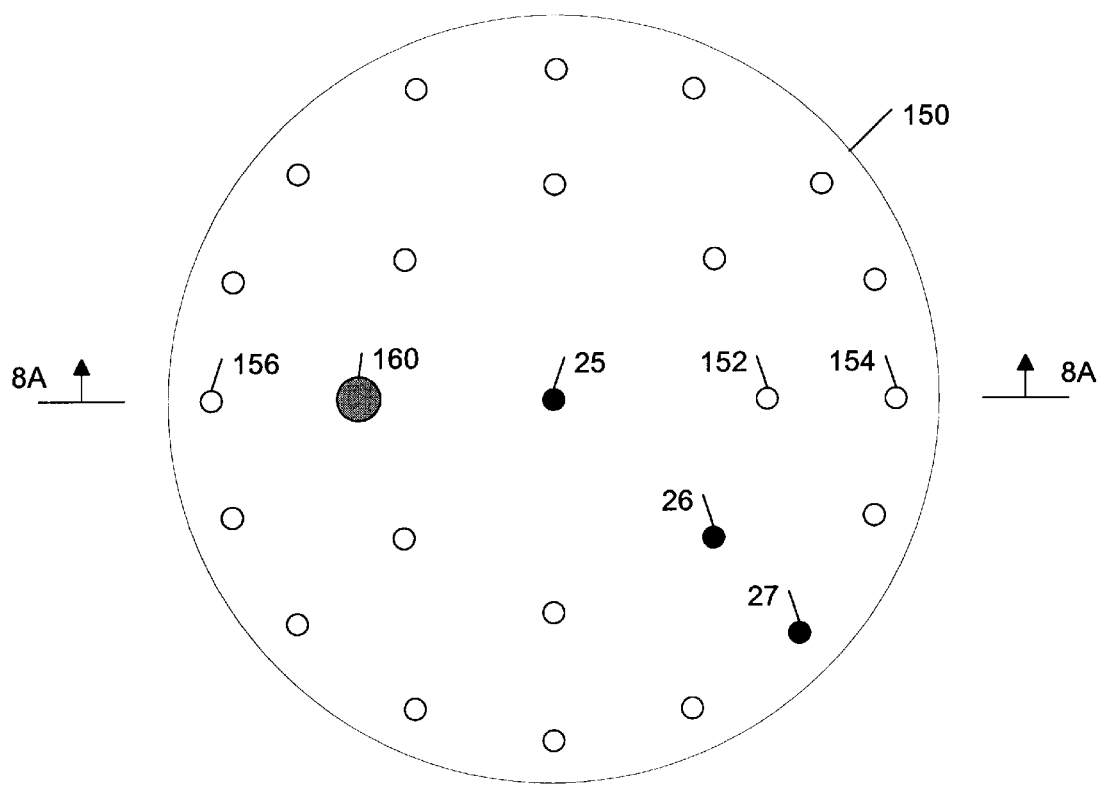

As shown in FIGS. 8A and 8B, in another embodiment, a reflector plate assembly 150 may include a plurality of orifices 152, 154, 156 which are coupled to a common gas plenum 158 which, in turn, is coupled to a purge gas input 160. Orifices 152–156 are arranged to uniformly introduce purge gas into the reflector cavity defined between substrate 12 and reflector plate assembly 150. Orifices 152–156 also are arranged to accommodate the locations of optical ports 25–27 through which temperature probes 24 receive light emitted by substrate 12. In operation, the purge gas flows into the reflector cavity at a flow rate of about 9–20 slm; in general, the flow rate should be less than the rate required to lift substrate 12 off of support structure 20. Purge gas is removed from the reflector cavity by a pump system 162 through an exhaust port 164.

Still other purge gas delivery systems are possible. For example, purge gas may be supplied by the rotating gas delivery system described in U.S. application Ser. No. 09/287,947, filed Apr. 7, 1999, and entitled "Apparatus and Methods for Thermally Processing a Substrate," which is incorporated herein by reference.

Other embodiments are within the scope of the claims.

For example, although the embodiments disclosed above have been described with reference to a single, relatively cool thermal reservoir (e.g., reflector plate assembly 22), other thermal reservoir configurations are possible. The thermal reservoir may be positioned at a different location inside thermal processing system 10. Two or more independent thermal reservoirs may be provided. The thermal reservoir may include a relatively hot surface, and different purge gases may be supplied into reflective cavity 15, which is defined between the thermal reservoir and the substrate, to control the temperature response of the substrate. In some embodiments, the temperature of the thermal reservoir may be changed during the thermal process to improve the temperature response of the substrate.

In another embodiment, the rate of heat transfer between a substrate and a thermal reservoir inside processing system 10 may be optimized by changing the emissivity of the thermal reservoir during the thermal process. For example, the top surface of reflector plate assembly 22 may include an electro-chromic coating with a reflectivity that may be selectively varied by changing the voltage applied across the coating. In operation, the reflectivity of reflection plate assembly 22 may be maximized during the heat-up phase of a thermal process, and the reflectivity may be minimized during the cool-down phase. In this way, the rate of heat transfer between the substrate and reflector plate assembly 22 may be decreased during the heat-up phase and increased during the cool-down phase.

In yet another embodiment, the rate of heat transfer between a substrate and a thermal reservoir inside processing system 10 may be optimized by changing the distance separating the substrate from the thermal reservoir. For example, support structure 20 may be configured to move up and down relative to the top surface of reflector plate assembly 22. In operation, in one embodiment, support structure 20 may position the substrate a relatively far distance from reflector plate assembly 22 during the heat-up phase of a thermal process, and support structure 20 may position the substrate a relatively close distance from reflector plate assembly 22 during the cool-down phase of the thermal process. In this way, the thermal conductivity between the substrate and reflector plate assembly 22 may be reduced during the heat-up phase of the thermal process and may be increased during the cool-down phase to improve the quality of devices produced on the substrate.

In another embodiment, the rate of heat transfer between a substrate and a thermal reservoir inside processing system 10 may be optimized by changing the pressure of a purge gas between the substrate and the thermal reservoir during a thermal process. For example, during a heat-up phase of the thermal process the pressure of the purge gas may be reduced to a sub-atmospheric pressure (e.g., 1–5 Torr), and during a cool-down phase of the thermal process the pressure may be increased to atmospheric pressure (760 Torr). The composition of the purge gas also may be changed during the thermal process. For example, during the heat-up phase the purge gas may consist of nitrogen, and during the cool-down phase the purge gas may consist of helium.

Systems and methods have been disclosed for controlling the temperature response of a substrate during rapid thermal processing. The invention may enable certain devices (e.g., ultra shallow junction transistors) to be formed with improved physical features and improved operating characteristics.

What is claimed is:

1. A method of thermally processing a substrate inside a thermal processing system, comprising:

heating the substrate in accordance with a heating schedule; and during the heating schedule, changing the rate of heat transfer between the substrate and a thermal reservoir inside the thermal processing system by changing the composition of a purge gas located between the substrate and the thermal reservoir.

2. A method of thermally processing a substrate inside a thermal processing system, comprising:

supplying a first purge gas into the thermal processing system;

heating the substrate in accordance with a heating schedule; and supplying into the thermal processing system a second purge gas that is different from the first purge gas, wherein the second purge gas is supplied into the thermal processing system during a cool-down phase of the heating schedule.

3. A method of thermally processing a substrate inside a thermal processing system, comprising:

heating the substrate in accordance with a heating schedule; and during the heating schedule, changing the rate of heat transfer between the substrate and a thermal reservoir inside the thermal processing system, wherein the thermal reservoir includes a relatively cool surface inside the processing chamber, and the thermal conductivity between the substrate and the relatively cool surface is increased during a cool-down phase of the heating schedule.

4. The method of claim 3, wherein the thermal conductivity is increased by supplying a gas with a relatively high thermal conductivity between the substrate and the relatively cool surface.

5. The method of claim 3, wherein a first purge gas is supplied between the substrate and the relatively cool surface during a heat-up phase of the heating schedule, and a second purge gas is supplied between the substrate and the relatively cool surface during the cool-down phase of the heating schedule, the second purge gas having a thermal conductivity that is greater than the thermal conductivity of the first purge gas.

6. The method of claim 5, wherein the first purge gas is selected from nitrogen, argon and xenon, and the second purge gas is selected from helium and hydrogen.

7. The method of claim 2 wherein the second purse gas is supplied into the thermal processing system at or near the time the substrate temperature has been heated to a target peak temperature.

8. The method of claim 7, wherein the second purge gas is supplied into the thermal processing system while the substrate temperature is decreasing.

9. The method of claim 7, wherein the first purge gas is supplied into the thermal processing system during a heat-up phase of the heating schedule.

10. The method of claim 2, wherein the thermal conductivity of the second purge gas is greater than the thermal conductivity of the first purge gas.

11. The method of claim 10, wherein the second purge gas includes helium or hydrogen or both.

12. The method of claim 10, wherein the first purge gas includes nitrogen and the second purge gas includes helium.

13. The method of claim 2, wherein the second purge gas is supplied into the thermal processing system between the substrate surface and a thermal reservoir inside the thermal processing system.

14. The method of claim 13, wherein:
- during a heat-up phase of the heating schedule, the first purge gas is supplied into the thermal processing system between the substrate surface and the thermal reservoir, and
- during the cool-down phase of the heating schedule, the second purge gas is supplied into the thermal processing system between the substrate surface and the thermal reservoir.

15. A method of thermally processing a substrate inside a thermal processing system, comprising:
- supplying a first purge gas into the thermal processing system;
- heating the substrate to a target temperature; and
- at or near the time the substrate temperature has been heated to the target temperature, supplying into the thermal processing system a second purge gas with a thermal conductivity that is greater than the thermal conductivity of the first purge gas.

16. The method of claim 15, wherein the second purge gas includes helium.

17. The method of claim 16, wherein the first purge gas includes nitrogen.

18. The method of claim 15, wherein at or near the time the substrate has been heated to the target temperature, the supply of the first purge gas into the thermal processing is terminated.

19. The method of claim 14, wherein the thermal conductivity of the second purge gas is greater than the thermal conductivity of the first purge gas.

20. A method of thermally processing a substrate inside a thermal processing system, comprising:
- heating the substrate in accordance with a heating schedule; and
- during the heating schedule, changing the rate of heat transfer between the substrate and a thermal reservoir inside the thermal processing system by changing the emissivity of a surface of the thermal reservoir.

21. A method of thermally processing a substrate inside a thermal processing system, comprising:
- heating the substrate in accordance with a heating schedule; and
- during the heating schedule, changing the rate of heat transfer between the substrate and a thermal reservoir inside the thermal processing system by changing the distance between the substrate and the thermal reservoir.

22. A method of thermally processing a substrate inside a thermal processing system, comprising:
- heating the substrate in accordance with a heating schedule; and
- during the heating schedule, changing the rate of heat transfer between the substrate and a thermal reservoir inside the thermal processing system by reducing the pressure of a purge gas located between the substrate and the thermal reservoir during a heat-up phase of the heating schedule and increasing the pressure of the purge gas during a cool-down phase of the heating schedule.

23. A method of thermally processing a substrate inside a thermal processing system, comprising:
- heating the substrate in accordance with a heating schedule; and
- during a cool-down phase of the heating schedule, changing the rate of heat transfer between the substrate and a thermal reservoir inside the thermal processing system by changing the composition of a thermal transport medium located between the substrate and the thermal reservoir.

* * * * *